US012164175B2

(12) United States Patent
Kitagawa et al.

(10) Patent No.: US 12,164,175 B2
(45) Date of Patent: Dec. 10, 2024

(54) MOUNTING PACKAGE FOR AN OPTICAL ELEMENT WITH INCLINED TRANSMISSION FILM AND FLAT MIRROR

(71) Applicant: KYOCERA Corporation, Kyoto (JP)

(72) Inventors: Akihiko Kitagawa, Kyoto (JP); Takashi Kimura, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 544 days.

(21) Appl. No.: 17/434,057

(22) PCT Filed: Feb. 20, 2020

(86) PCT No.: PCT/JP2020/006691
§ 371 (c)(1),
(2) Date: Aug. 26, 2021

(87) PCT Pub. No.: WO2020/175303
PCT Pub. Date: Sep. 3, 2020

(65) Prior Publication Data
US 2022/0137326 A1    May 5, 2022

(30) Foreign Application Priority Data

Feb. 27, 2019  (JP) .................................. 2019-033444

(51) Int. Cl.
*G02B 7/18*    (2021.01)
*G02B 7/182*   (2021.01)
(Continued)

(52) U.S. Cl.
CPC ........... *G02B 7/181* (2013.01); *G02B 7/1827* (2013.01); *H01S 5/022* (2013.01); *H01S 5/0239* (2021.01)

(58) Field of Classification Search
CPC ..... G02B 7/181; G02B 7/1827; H01S 5/0239; H01S 5/022
(Continued)

(56) References Cited

U.S. PATENT DOCUMENTS

2006/0245195 A1* 11/2006 Kim ...................... H01L 33/647
                                                          257/E33.072
2011/0141734 A1*  6/2011 Li ....................... G02B 19/0028
                                                                  362/335
(Continued)

FOREIGN PATENT DOCUMENTS

JP       2004-031900 A        1/2004
JP       2013016567 A   *     1/2013
(Continued)

OTHER PUBLICATIONS

JP-2013016567-A English translation—Jan. 24, 2013—Fujikawa Y.*

*Primary Examiner* — Sharrief I Broome
(74) *Attorney, Agent, or Firm* — Volpe Koenig

(57) ABSTRACT

An optical element mounting package includes an optical component and a base. The optical component reflects light. The base has a recess. In the recess, a first mounting portion and a second mounting portion are provided. On the first mounting portion, an optical element is to be mounted. On the second mounting portion, the optical component is mounted. The optical component includes a reflective surface and a transmission film on the reflective surface. A front surface of the transmission film is inclined relative to the reflective surface.

10 Claims, 14 Drawing Sheets

(51) Int. Cl.
*H01S 5/022* (2021.01)
*H01S 5/0239* (2021.01)

(58) Field of Classification Search
USPC .......................................... 359/871
See application file for complete search history.

(56) References Cited

U.S. PATENT DOCUMENTS

2017/0365977 A1* 12/2017 Tamura ............... H01S 5/18388
2018/0287334 A1* 10/2018 Miyata .................. H01S 5/0215
2018/0366903 A1* 12/2018 Miyata .................. H01S 5/0216

FOREIGN PATENT DOCUMENTS

| JP | 2016-500902 A | 1/2016 |
| JP | 2017-098494 A | 6/2017 |
| WO | 2014/060892 A1 | 4/2014 |

\* cited by examiner

FIG. 9A1
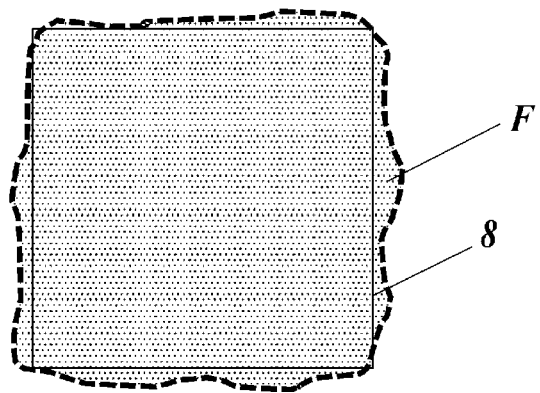
FIG. 9A2
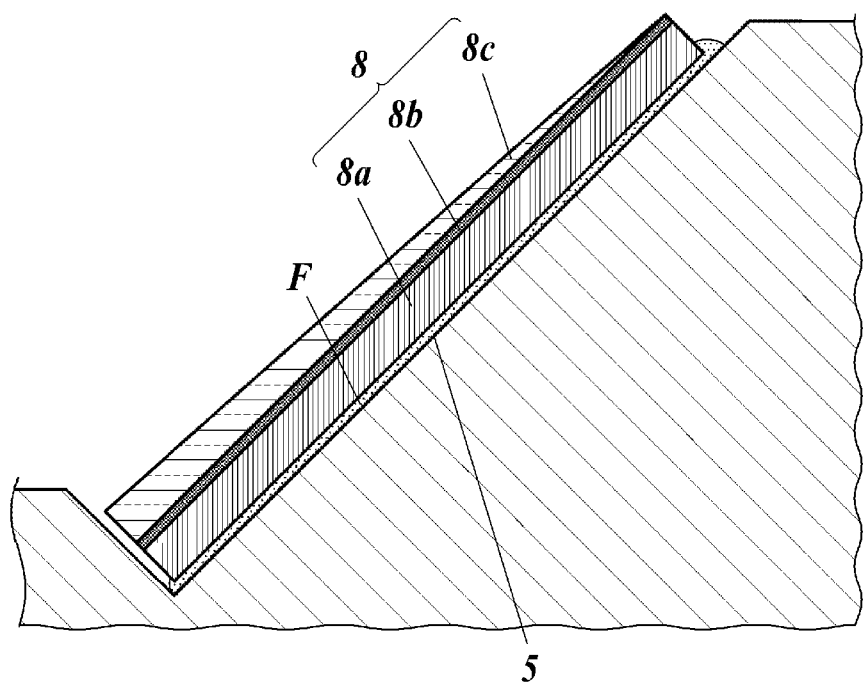

FIG. 9B1
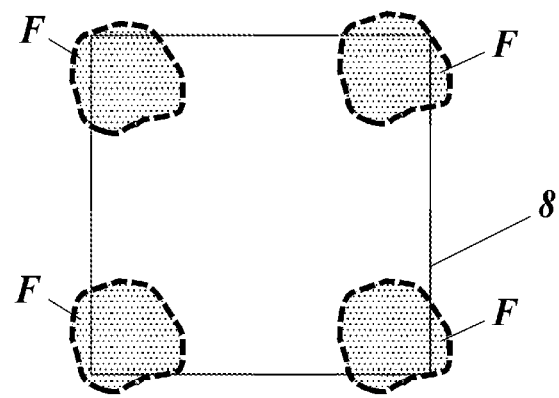
FIG. 9B2
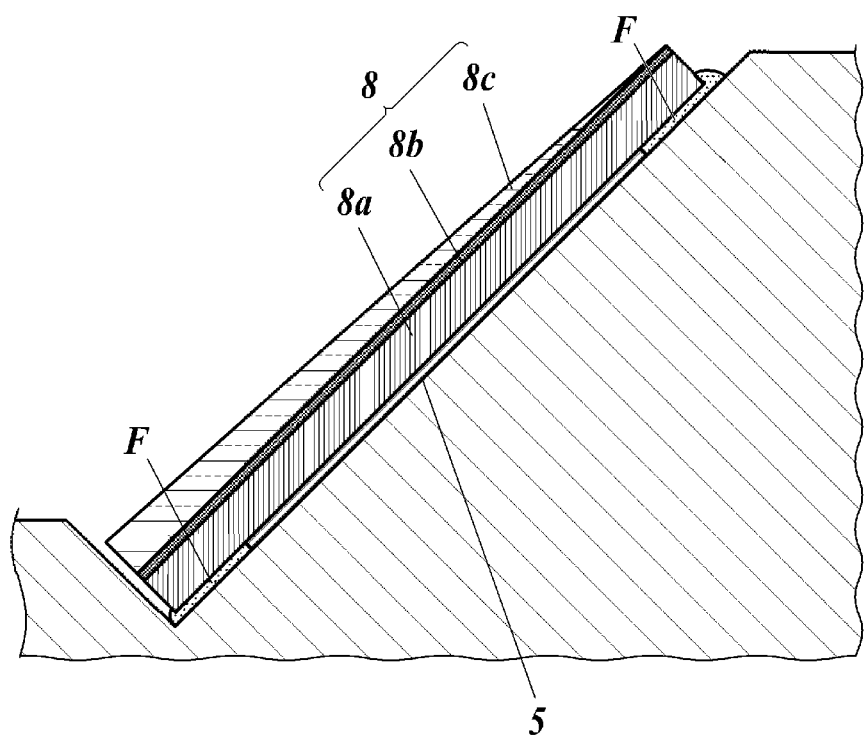

FIG. 9C1
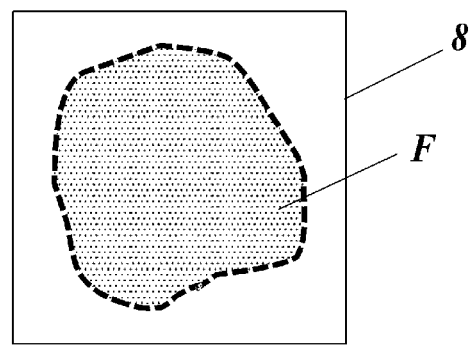
FIG. 9C2
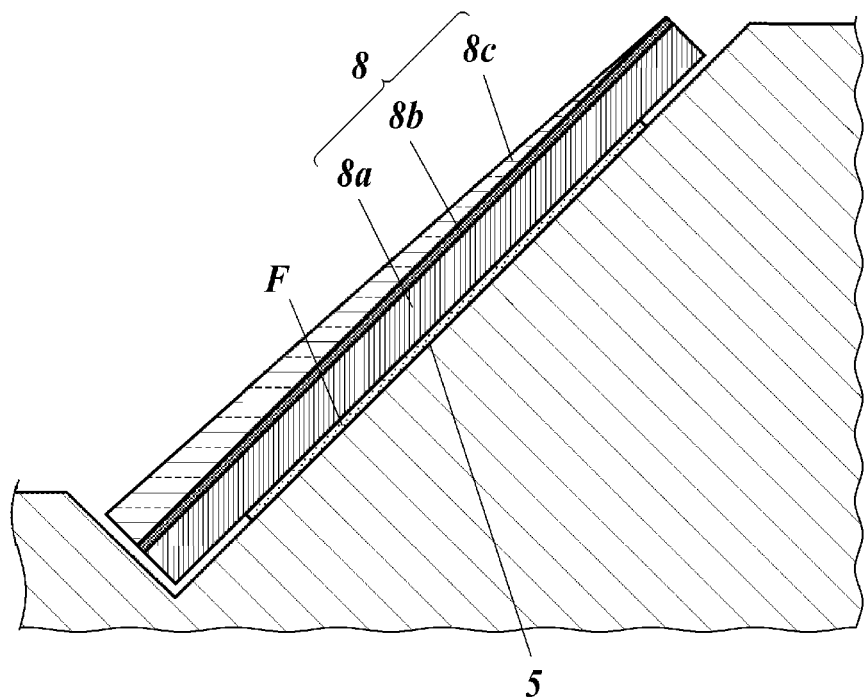

FIG. 10A1
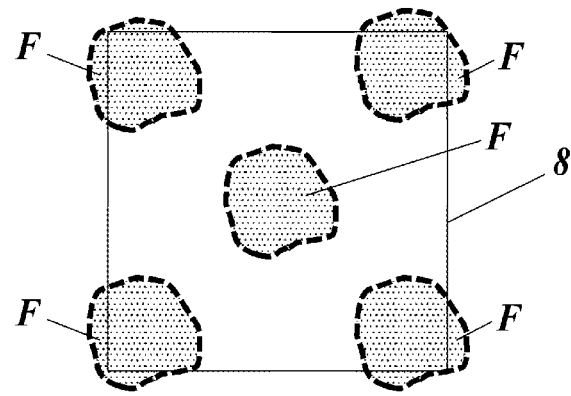
FIG. 10A2
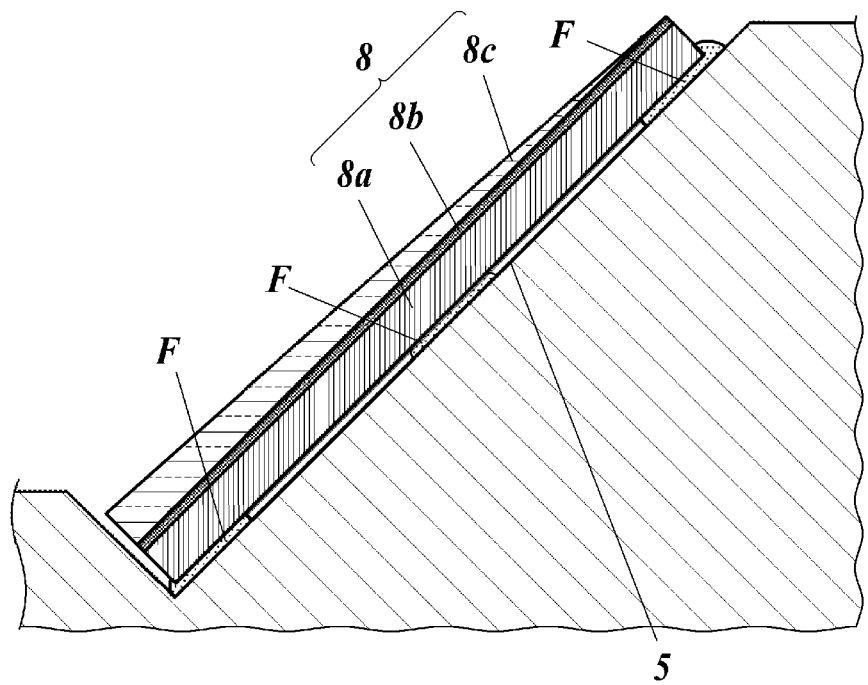

FIG. 10B1
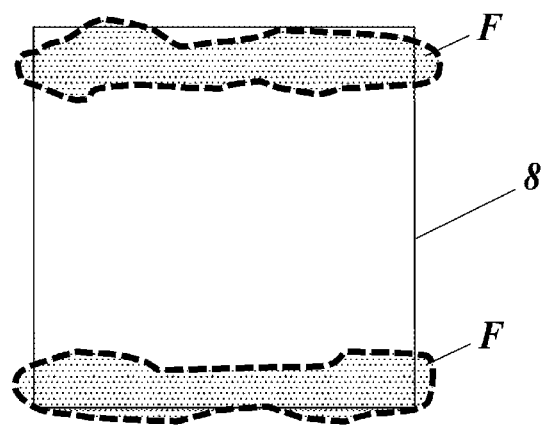
FIG. 10B2
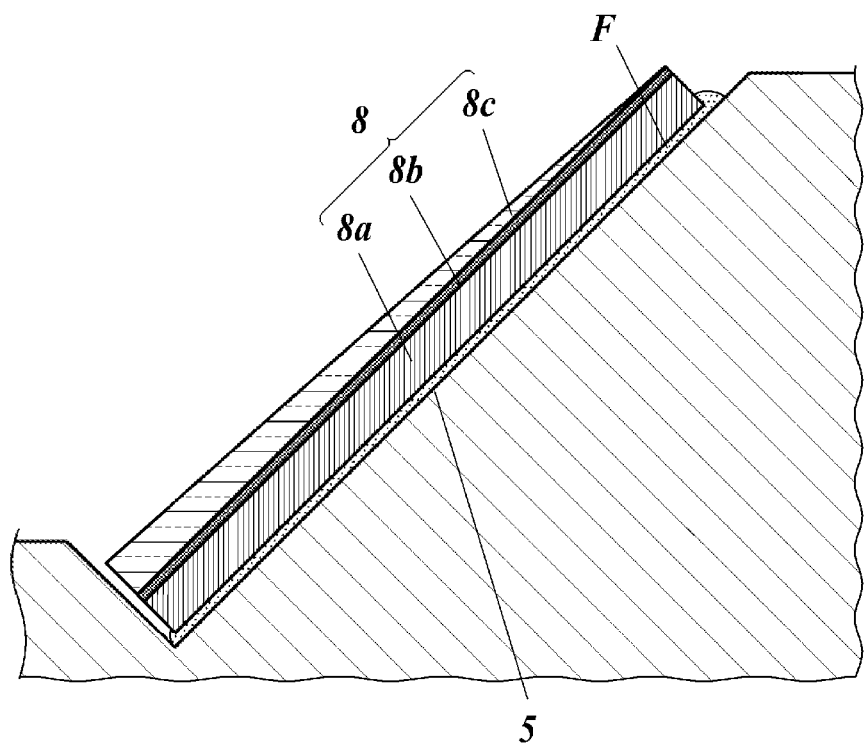

FIG. 10C1
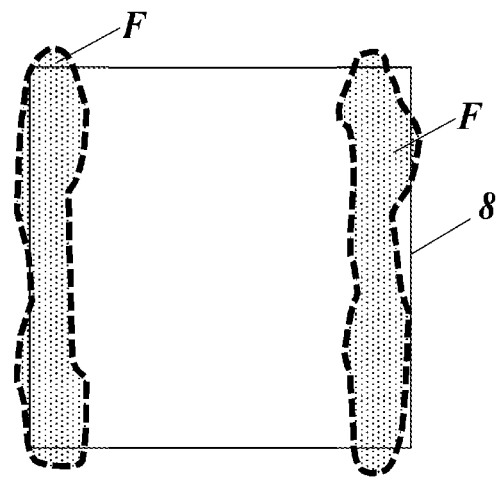
FIG. 10C2
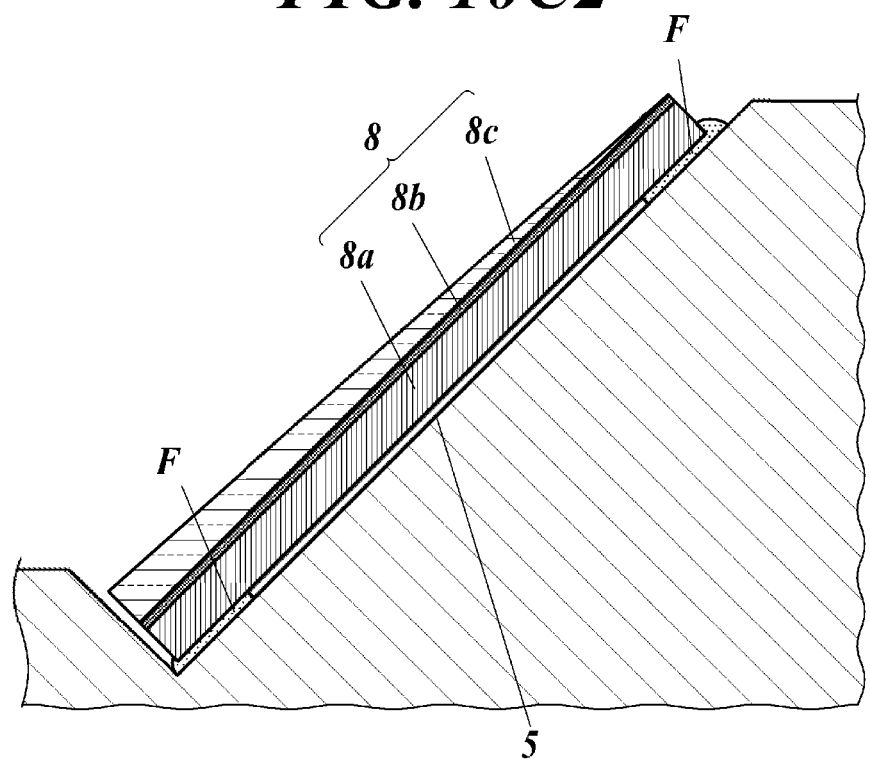

MOUNTING PACKAGE FOR AN OPTICAL ELEMENT WITH INCLINED TRANSMISSION FILM AND FLAT MIRROR

CROSS REFERENCE TO RELATED APPLICATIONS

This application is the U.S. National Stage, under 35 U.S.C. § 371, of International Application No. PCT/JP2020/006691, filed Feb. 20, 2020, which claims the benefit of Japanese Patent Application No.: 2019-033444, filed Feb. 27, 2019, the contents of which are hereby incorporated by reference herein.

FIELD OF INVENTION

The present invention relates to an optical element mounting package, an electronic device, and an electronic module.

BACKGROUND

There has been a TO (Transistor Outline)-Can semiconductor laser where a laser chip is mounted. (See, for example, JP 2004-031900 A).

SUMMARY

An optical element mounting package of the present disclosure includes:
  an optical component that reflects light; and
  a base having a recess in which a first mounting portion where an optical element is to be mounted and a second mounting portion where the optical component is mounted are provided,
  wherein the optical component includes a reflective surface and a transmission film on the reflective surface, and a front surface of the transmission film is inclined relative to the reflective surface.

An electronic device of the present disclosure includes:
  the above optical element mounting package; and
  an optical element mounted on the first mounting portion.

An electronic module of the present disclosure includes:
  the above electronic device; and
  a module substrate on which the electronic device is mounted.

BRIEF DESCRIPTION OF THE DRAWINGS

FIG. 9A1 is a diagram to explain a first joined form of the optical component.

FIG. 9A2 is a diagram to explain the first joined form of the optical component.

FIG. 9B1 is a diagram to explain a second joined form of the optical component.

FIG. 9B2 is a diagram to explain the second joined form of the optical component.

FIG. 9C1 is a diagram to explain a third joined form of the optical component.

FIG. 9C2 is a diagram to explain the third joined form of the optical component.

FIG. 10A1 is a diagram to explain a fourth joined form of the optical component.

FIG. 10A2 is a diagram to explain the fourth joined form of the optical component.

FIG. 10B1 is a diagram to explain a fifth joined form of the optical component.

FIG. 10B2 is a diagram to explain the fifth joined form of the optical component.

FIG. 10C1 is a diagram to explain a sixth joined form of the optical component.

FIG. 10C2 is a diagram to explain the sixth joined form of the optical component.

DETAILED DESCRIPTION

Hereinafter, embodiments of the present disclosure will be described in detail with reference to the drawings.

First Embodiment

Figure 1:
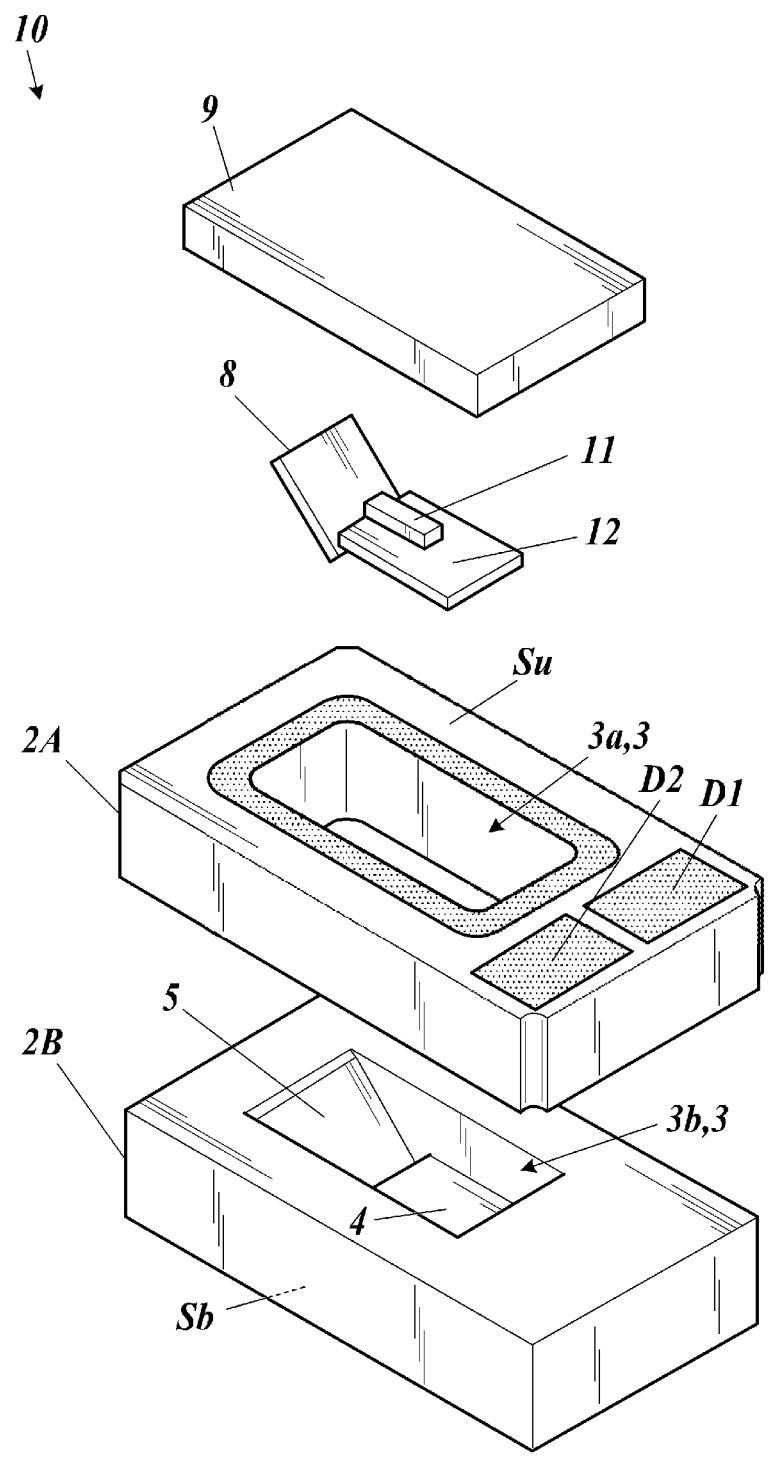
FIG. 1 is an exploded perspective view of an electronic device according to a first embodiment of the present disclosure.
Figure 2:
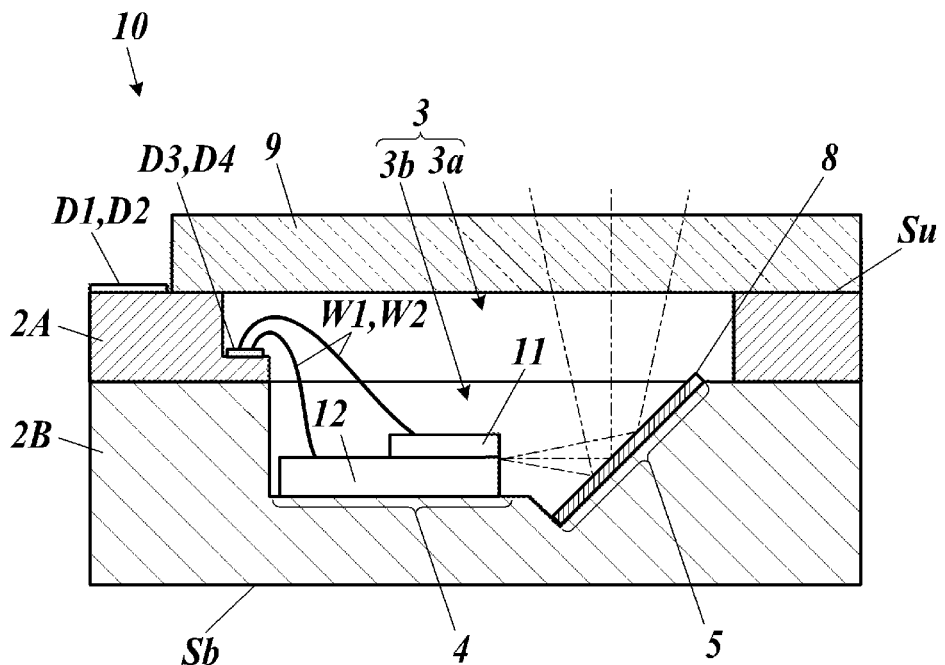
FIG. 2 is a vertical sectional view of the electronic device according to the first embodiment.
Figure 3:
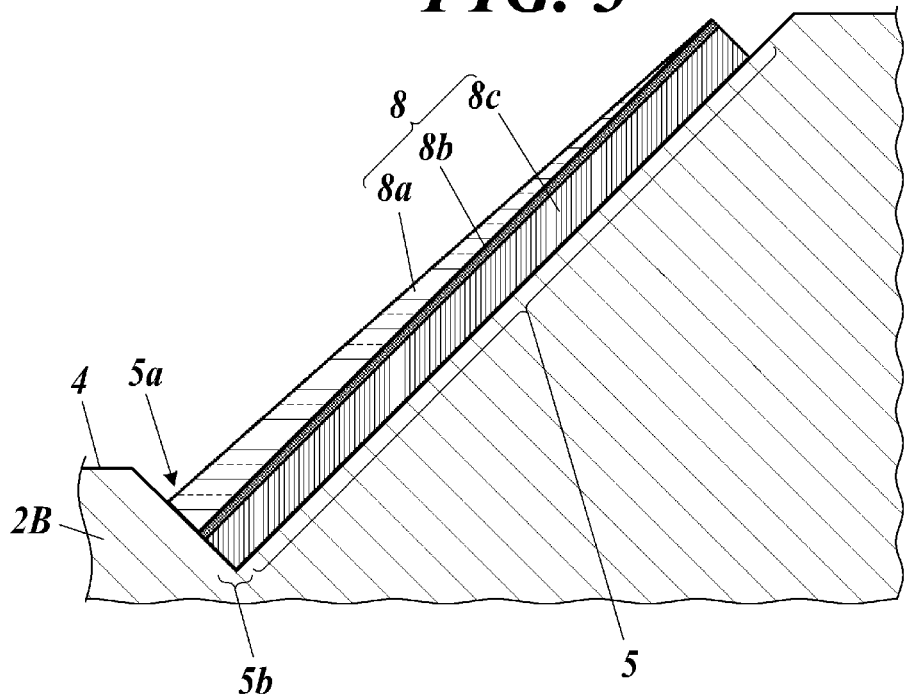
FIG. 3 is an enlarged view of an optical component shown in FIG. 2.

FIG. 1 is an exploded perspective view of an electronic device according to a first embodiment of the present disclosure. FIG. 2 is a vertical sectional view of the electronic device according to the first embodiment. FIG. 3 is an enlarged view of an optical component shown in FIG. 2. Hereinafter, description is made with a first main surface Su side and a second main surface Sb side of a base 2 regarded as upward and downward, respectively. However, directions of an electronic device 10 in use do not need to be the same as those in the description.

The electronic device 10 according to the first embodiment includes: the base 2 having the first main surface Su, the second main surface Sb, and a recess 3 that is open in the first main surface Su; an optical element 11 and an optical component 8 that are mounted in the recess 3; and a lid 9 with which the opening of the recess 3 is closed. The lid 9 is made of a material that transmits light (glass or resin), and is joined to the first main surface Su of the base 2 with a joining material. The electronic device 10 excluding the lid 9, the optical element 11 and a submount 12 corresponds to an optical element mounting package.

The base 2 has an upper base 2A mainly made of an insulating material and a lower base 2B made of a metal. The upper base 2A is provided with a through hole 3a passing therethrough in the up-down direction. The lower base 2B is provided with a concave hole 3b communicating with the through hole 3a. The upper base 2A and the lower base 2B are joined, and when they are joined, the concave hole 3b and the through hole 3a communicate, so that the recess 3, the upper side of which is open, is configured.

The basic shape part of the upper base 2A is made of, for example, a ceramic material, such as an aluminum oxide sintered body (alumina ceramic), an aluminum nitride sintered body, a mullite sintered body or a glass-ceramic sintered body. This part can be manufactured, for example, by molding ceramic green sheets of a pre-sintered ceramic material into a predetermined shape by punching or die machining, and sintering the ceramic green sheets. The upper base 2A further includes electrodes D1 to D4 (FIG. 1 and FIG. 2) arranged on the first main surface Su and wiring conductors passing inside. These conductors can be formed by applying conductive paste to predetermined points of the ceramic green sheets or filling predetermined points thereof with the conductive paste before sintering, and sintering the conductive paste together with the ceramic green sheets. Notches in corners of the side surface of the upper base 2A may not be provided.

The lower base 2B is made of, for example, a metal material having high thermal conductivity, such as copper or aluminum, and can be formed, for example, by stamping or the like. In the concave hole 3b of the lower base 2B, a first mounting portion 4 where the optical element 11 is mounted through the submount 12 and a second mounting portion 5 where the optical component 8 is mounted are provided. The first mounting portion 4 is, for example, a planar surface extending in the horizontal direction. The "planar" surface means not only a completely flat surface but also a surface that can be regarded as a flat surface if small irregularities are neglected. The second mounting portion 5 is a planar surface inclined relative to the horizontal direction. The second mounting portion 5 is inclined in such a manner as to be at a higher position as it is away from the first mounting portion 4. The second mounting portion 5 may have a groove 5a at a lower position than the first mounting portion 4. The second mounting portion 5 has a concave corner 5b (FIG. 2) with which one end of the optical component 8 is positioned. The lower base 2B may be made of a ceramic material, like the upper base 2A. If the lower base 2B is made of a ceramic material, it can be formed by die machining or the like. If the upper base 2A and the lower base 2B are made of the same sintered body, they may be formed in an integrated manner.

The optical element 11 is, for example, a laser diode (semiconductor laser). The optical element 11 may be any directional light-emitting element. The optical element 11 is joined to the upper surface of the submount 12 with a joining material, and the submount 12 is joined to the upper surface of the first mounting portion 4 with a joining material. The outgoing direction of light of the optical element 11 is a direction (e.g. horizontal direction) along the upper surface of the first mounting portion 4 or the upper surface of the submount 12 toward the second mounting portion 5. The optical element 11 is electrically connected to the electrodes D3, D4 in the recess 3 of the upper base 2A through bonding wires W1, W2 and a wiring conductor(s) of the submount 12. The electrodes in the recess 3 are connected to the electrodes D1, D2 outside the recess 3 through wiring conductors, and the optical element 11 is driven by power input through the electrodes D1, D2.

The optical component 8 is a flat mirror, and reflects, upward, incident/entering light emitted from the optical element 11. The reflected light goes above the electronic device 10 through the lid 9. As shown in FIG. 3, the optical component 8 includes a plate-like base member 8a, a reflective film 8b formed on one surface of the base member 8a, and a transmission film 8c formed on the reflective film 8b. The base member 8a is made of, for example, glass, a metal, such as Al, Ag or Si, or an organic material. If the base member 8a is made of a metal, the reflective film 8b may be omitted, and in this case, one surface of the base member 8a functions as a reflective surface. The reflective surface may have a planar shape. The reflective film 8b has a surface that functions as the reflective surface. The reflective film 8b is a metal film of Ag, Al, Au, Pt, Cr or the like and formed by a thin film manufacturing technique, such as vapor deposition, sputtering or plating. The transmission film 8c is made of a material that transmits light, such as SiO, $SiO_2$, $Al_2O_3$, TiO, $Ta_2O_5$, a dielectric multilayer film, $MgF_2$ or a silicon acrylic coating. The transmission film (protective film) 8c protects the reflective surface. The transmission film 8c has uniform refractive index and uniform transparency, independent of point/part of the transmission film 8c. The transmission film 8c has a thickness gradient by which its front surface S1 (FIG. 3) is inclined relative to the reflective surface S2 (FIG. 3).

Figure 4A:
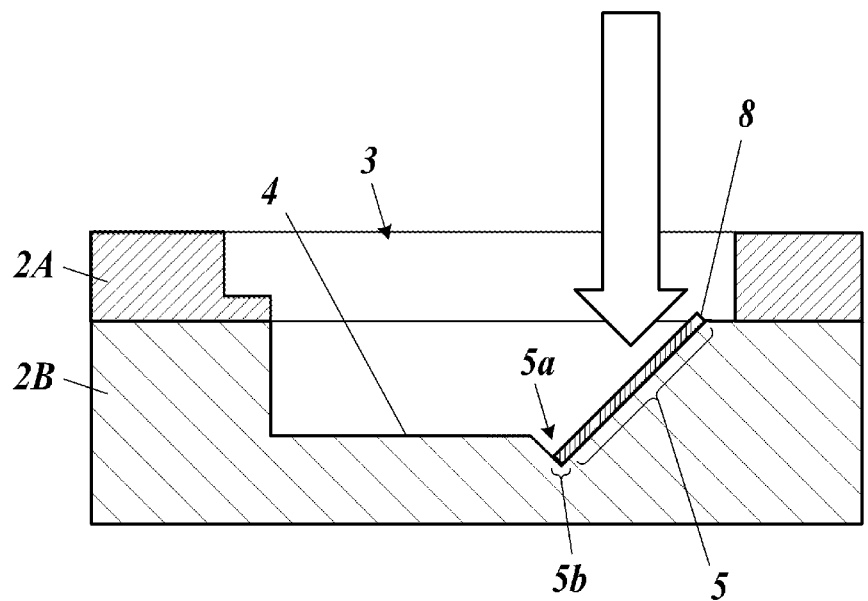
FIG. 4A is a diagram to explain a first example of an optical component mounting method.
Figure 4B:
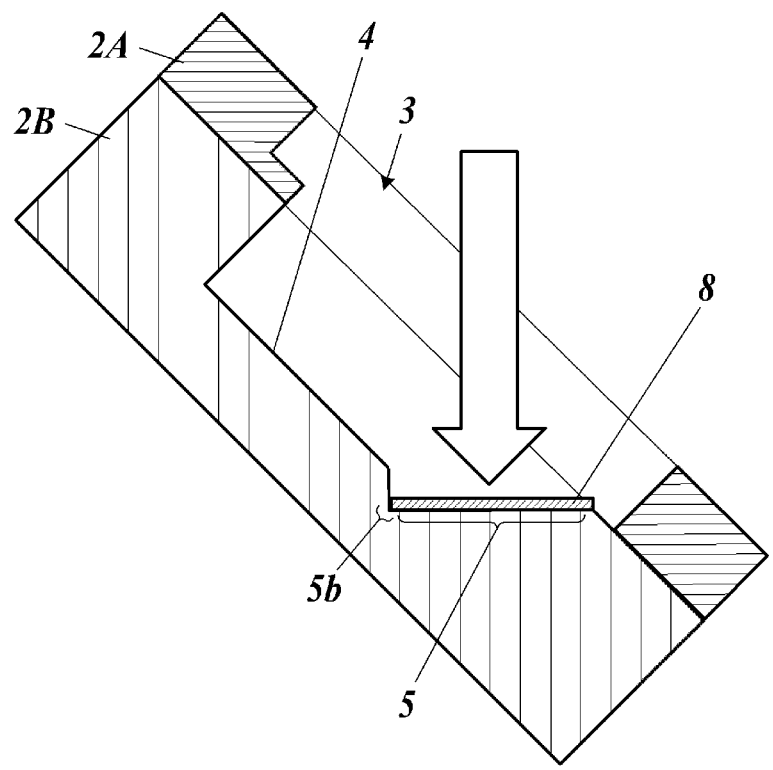
FIG. 4B is a diagram to explain a second example of the optical component mounting method.

FIG. 4A and FIG. 4B are explanatory views of first and second examples of an optical component mounting method, respectively.

In order to mount the optical component 8 on the second mounting portion 5, one edge of the optical component 8 is made to butt up against the concave corner 5b of the second mounting portion 5, so that the optical component 8 is positioned. Then, in the positioned state, the optical component 8 is joined to the second mounting portion 5. The optical component 8 is joined to the second mounting portion 5 with a joining material, such as a solder material exemplified by SnAgCu and AuSu, a metal nanoparticle sintered material containing Ag, Cu or the like as a main component, or an inorganic adhesive containing alumina, zirconia or the like as a main component. As shown in FIG. 4A, the optical component 8 may be mounted on the second mounting portion 5 with the second main surface Sb of the base 2 horizontally arranged. In the case of this mounting, the optical component 8 is arranged on the second mounting portion 5 in the state of being inclined relative to the horizontal plane, and one edge thereof is made to butt up against the concave corner 5b by gravity, so that the optical component 8 is positioned. Then, the joining material is solidified. Thus, the optical component 8 can be mounted with high positional accuracy. Alternatively, as shown in FIG. 4B, the optical component 8 may be mounted on the second mounting portion 5 with the base 2 arranged such that the second mounting portion 5 is horizontal. In the case of this mounting, the joining material is solidified in the state in which the optical component 8 and the second mounting portion 5 are horizontal. This mounting method achieves high inclination-angle accuracy of the optical component 8.

Figure 5A:
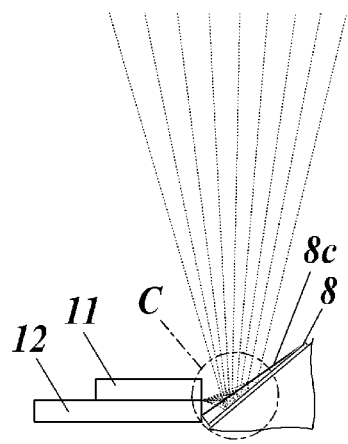
FIG. 5A is an optical path diagram of a reflective surface provided with a transmission film.
Figure 5B:
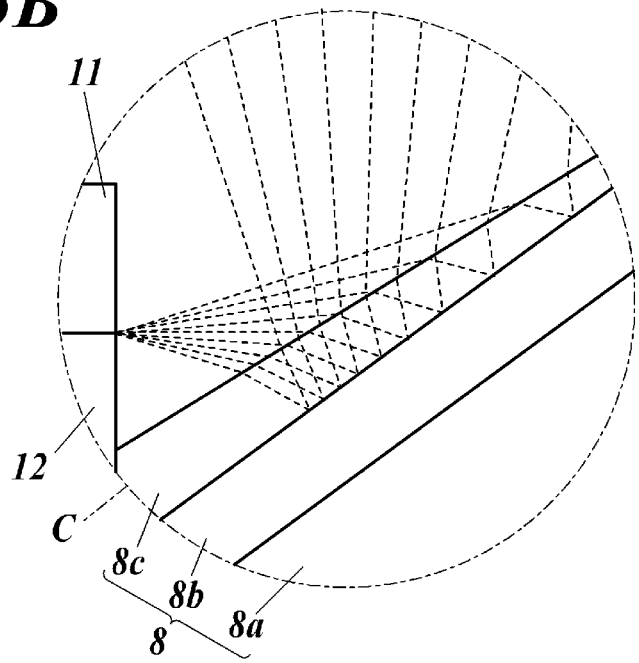
FIG. 5B is an enlarged view of a part of FIG. 5A.
Figure 5C:
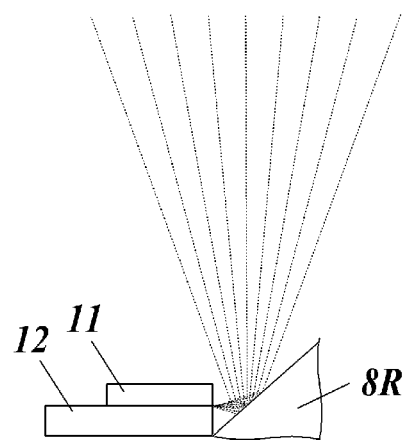
FIG. 5C is an optical path diagram of the reflective surface provided with no transmission film according to a comparative example.

FIG. 5A, FIG. 5B and FIG. 5C are an optical path diagram of the reflective surface provided with the transmission film, an enlarged view thereof, and an optical path diagram of the reflective surface provided with no transmission film according to a comparative example, respectively.

As shown in FIG. 5A and FIG. 5B, light entering the transmission film 8c and light traveling outward from the transmission film 8c are refracted on the front surface of the transmission film 8c. Further, due to the transmission film 8c having thickness, light having passed through the transmission film 8c and reflected by the reflective surface exits from a position(s) different from the entering/incident position(s). Further, due to the thickness gradient of the transmission film 8c, the angle of the light traveling outward from the transmission film 8c is closer to a right angle, as compared with the angle thereof in the case where the entering light is totally reflected by the front surface of the transmission film 8c like the case shown in FIG. 5C. Thanks to the work, as compared with the configuration of an optical component 8R shown in FIG. 5C, in which light is totally reflected by the reflective surface, the configuration shown in FIG. 5A and FIG. 5B can make the angle of beam spread smaller. This beam characteristic change is obtained by the work of the transmission film 8c. Beam characteristics, such as the angle of spread beam and beam inclination, can be variously changed by changing the thickness gradient, the inclination angle, the refractive index and/or the like of the transmission film 8c.

Figure 6A:
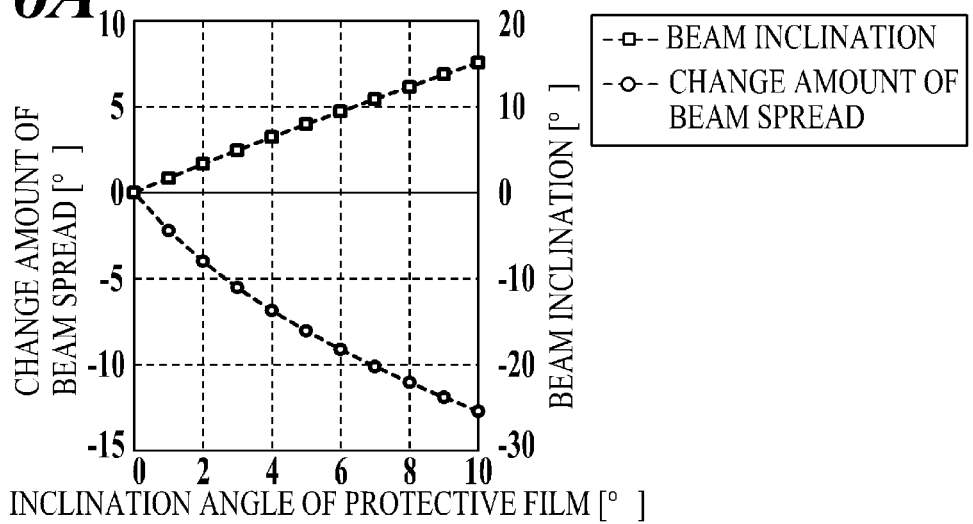
FIG. 6A shows relationships between a parameter of the optical component and beam characteristics, and is a relationship graph of the inclination angle of the transmission film and the beam characteristics.
Figure 6B:
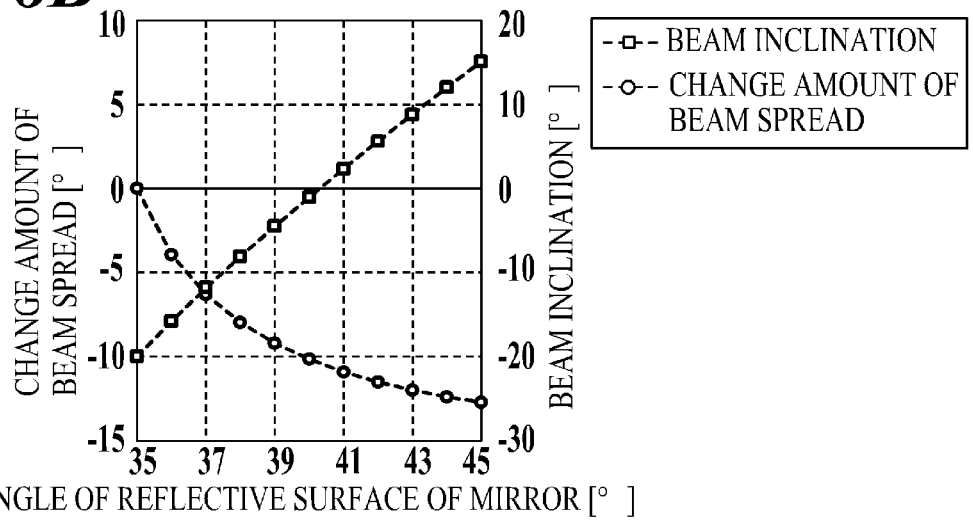
FIG. 6B shows relationships between a parameter of the optical component and the beam characteristics, and is a relationship graph of the angle of the reflective surface and the beam characteristics.
Figure 6C:
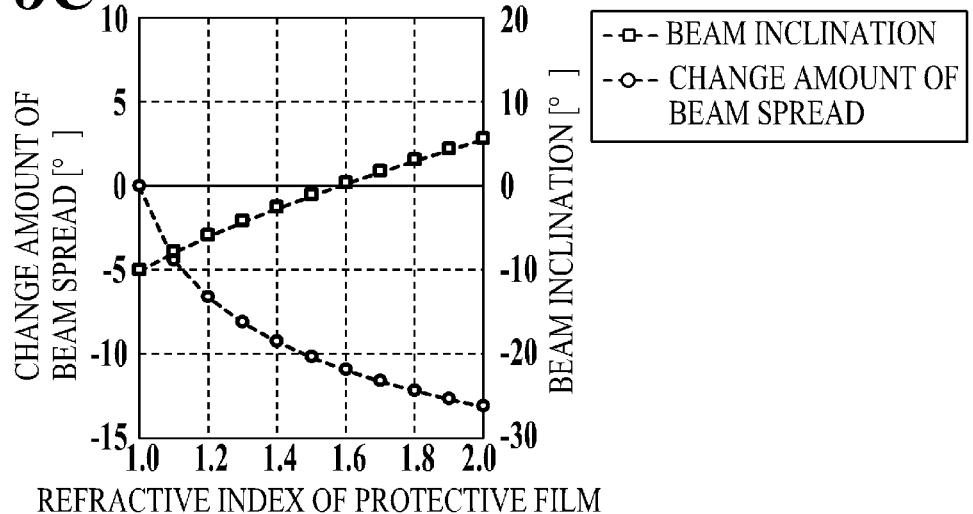
FIG. 6C shows relationships between a parameter of the optical component and the beam characteristics, is a relationship graph of the refractive index of the transmission film and the beam characteristics.

FIG. 6A, FIG. 6B and FIG. 6C each show relationships between a predetermined parameter of the optical component and the beam characteristics, and are respectively a relationship graph of the inclination angle of the transmission film and the beam characteristics, a relationship graph of the angle of the reflective surface and the beam characteristics, and a relationship graph of the refractive index of the transmission film and the beam characteristics. The beam inclination is expressed with the vertical direction as 0°. Values shown in FIG. 6A are calculated under the following fixed conditions: the angle of the reflective surface is 45°; and the refractive index of the transmission film 8c is 1.5. Values shown in FIG. 6B are calculated under the following fixed conditions: the inclination angle of the transmission film 8c is 10°; and the refractive index of the transmission film 8c is 1.5. Values shown in FIG. 6C are calculated under the following fixed conditions: the angle of the reflective surface is 40°; and the inclination angle of the transmission film 8c is 10°. The angle of the reflective surface is expressed with the horizontal direction as 0°. The inclination angle of the transmission film 8c means the angle of the front surface of the transmission film 8c relative to the reflective surface, and positive values represent the inclination at which the transmission film 8c becomes thinner in a direction to be away from the first mounting portion 4. The refractive index of the transmission film 8c can be changed by the material of the transmission film 8c. For example, optical glass materials of different components can achieve refractive indices of 1.4 to 1.8, and resin-based materials of different components can achieve refractive indices of 1.5 to 1.9.

As shown in FIG. 6A to FIG. 6C, the inclination angle of the reflective surface of the optical component 8, the inclination angle of the transmission film 8c and the refractive index of the transmission film 8c can be appropriately changed. The selection for these parameters enables appropriate adjustment of the beam characteristics (outgoing angle and beam spread) of the outgoing light from the electronic device 10 even if the beam characteristics of the optical element 11 are fixed.

In the first embodiment, the selection for the inclination angle and the refractive index of the transmission film 8c makes the inclination angle of the reflective surface of the optical component 8 smaller than 45°, and makes the reflected light of the optical component 8 be send out at an angle close to the angle of the vertical direction, as compared with the case of no transmission film 8c. Because the inclination angle of the reflective surface of the optical component 8 is small, adoption of this configuration can make the height dimension of the electronic device 10 smaller than that in the configuration in which the transmission film 8c having the thickness gradient is not provided, and also can send out a beam to a desired angle.

Further, in the first embodiment, the selectin for the inclination angle and the refractive index of the transmission film 8c makes the angle of beam spread of the outgoing light of the electronic device 10 smaller than the angle of beam spread of the outgoing light of the optical element 11. Thanks to this configuration, even if the angle of beam spread of the optical element 11 is larger than the angle of beam spread requested, this request for the angle of beam spread can be met by the selection regarding the transmission film 8c. Conversely, the selection for the inclination angle and the refractive index of the transmission film 8c may make the angle of beam spread of the outgoing light of the electronic device 10 larger than the angle of beam spread of the outgoing light of the optical element 11. Thanks to this configuration, even if the angle of beam spread of the optical element 11 is smaller than the angle of beam spread requested, this request for the angle of beam spread can be met by the selection regarding the transmission film 8c.

FIG. 7A to FIG. 7D show first to fourth modifications of the optical component having the transmission film different in shape, respectively.

Figure 7A:
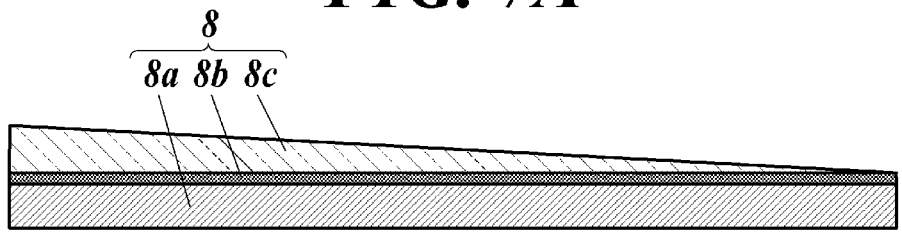
FIG. 7A shows a first modification of the optical component having the transmission film different in shape.
Figure 7B:
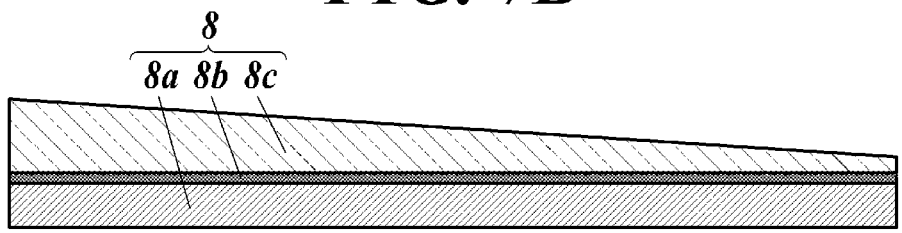
FIG. 7B shows a second modification of the optical component having the transmission film different in shape.
Figure 7C:
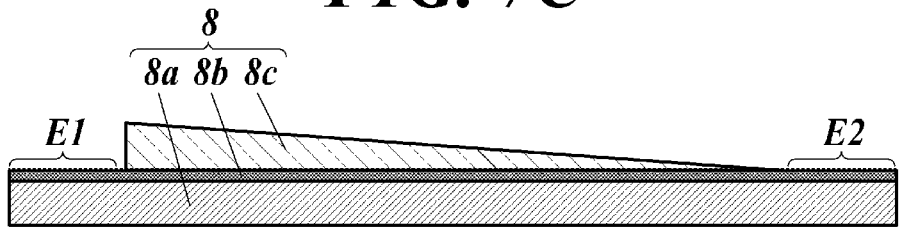
FIG. 7C shows a third modification of the optical component having the transmission film different in shape.
Figure 7D:
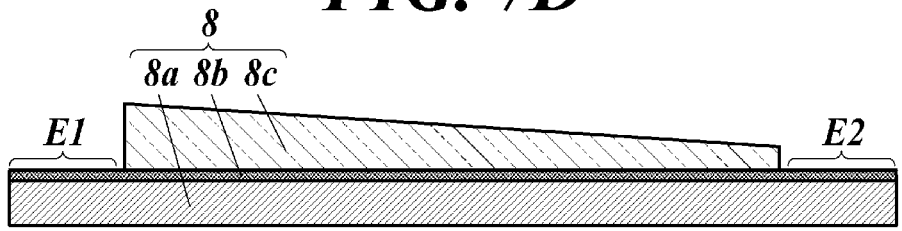
FIG. 7D shows a fourth modification of the optical component having the transmission film different in shape.

In the optical component 8 that is a flat mirror, for example, as shown in FIG. 7A and FIG. 7B, the transmission film 8c may be formed on the entire reflective surface, or as shown in FIG. 7C and FIG. 7D, the transmission film 8c may be formed on the reflective surface except edge parts E1, E2. Further, as shown in FIG. 7A and FIG. 7C, the configuration may be adopted in which the thinnest part of the transmission film 8c has almost no thickness, or as shown in FIG. 7B and FIG. 7D, the configuration may be adopted in which the thinnest part of the transmission film 8c has a thickness.

The transmission film 8c having the thickness gradient can be manufactured as follows: in a vacuum film forming apparatus employing vapor deposition, sputtering or the like, arrange the reflective surface in such a manner as to be inclined relative to a molding material source from the state in which the reflective surface is directly in front of the molding material source; and perform a film filming process. This manufacturing method generates the thickness gradient by which a film is thicker at a point closer to the molding material source, and accordingly thinner at a point farther from the molding material source.

Alternatively, the transmission film 8c having the thickness gradient can be manufactured as follows: arrange each base member 8a having the reflective film 8b in the inclined state; and perform coating with a spray. The base members 8a are arranged on jigs by being put close to one another so that coating liquid does not go down toward surfaces at the back from the reflective surfaces or run down therefrom. The coating liquid sprayed to the reflective surfaces much accumulates on the deep sides on the reflective surfaces, which are arranged on the jigs by being put close to one another. The much accumulated coating liquid spreads over the entire reflective surfaces by surface tension, so that the transmission films 8c are each thinner at a point closer to the spray, and accordingly thicker at a point farther from the spray, namely, at a deeper point.

The transmission film 8c avoiding the edge parts can be formed by masking in forming the transmission film 8c with a vacuum film forming apparatus or a spray.

In the first embodiment, the optical component 8 is a flat mirror shown in FIG. 7A, FIG. 7B, FIG. 7C or FIG. 7D, and adopts the configuration in which the transmission film 8c becomes thicker toward the first mounting portion 4. According to this configuration, the base member 8a is curved inward at a point near the first mounting portion 4 by stress generated when the transmission film 8c cures. The inward curve means a curve (curving) caused by the transmission film 8c side of the base member 8a shrinking and the back side thereof extending. The inward curve of the base member 8a is caused by the stress of the transmission film 8c generated in film forming. As the transmission film 8c is thicker, the generated stress is larger, so that the sharper inward curve is caused at a point where the transmission film 8c is thicker. The inward curve of the base member 8a makes the outgoing light, with a reflection angle, more stand up (nearly vertical) at a point closer to the optical element 11, and consequently can reduce return light that is light reflected by the side of the optical component 8 close to the optical element 11 toward the optical element 11. The reduction of the return light can improve reliability of the optical element 11 and extend its life.

Figure 8:
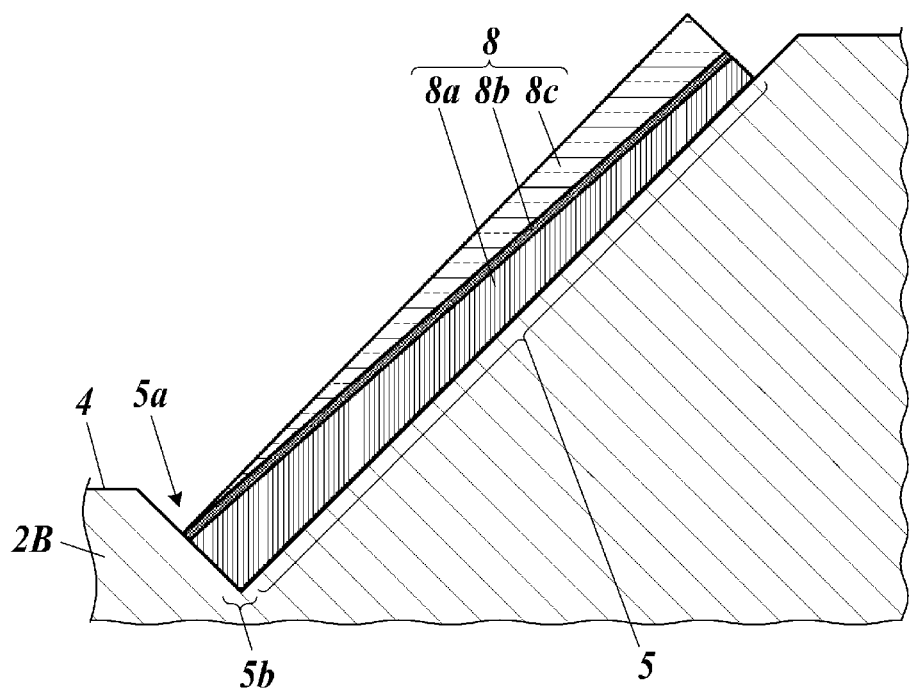
FIG. 8 shows a fifth modification of the optical component having the base member different in shape.

FIG. 8 shows a fifth modification of the optical component having the base member different in shape.

As shown in FIG. 8, the base member 8a of the optical component 8 may be configured in such a manner as to become thicker toward the first mounting portion 4. This configuration can reduce thermal distortion (deformation) of the optical component 8 if heat from the optical element 11 is transferred to the optical component 8 because, of the base member 8a, a part to which the heat is more likely to be transferred is thick. Thus, the configuration reduces distortion of the optical component 8 caused by heat generation of the optical element 11, and accordingly suppresses displacement of the optical path of the outgoing light from the electronic device 10 caused by heat generation. In FIG. 8, the configuration is adopted in which the transmission film 8c becomes thinner toward the first mounting portion 4, but this inclination direction of the transmission film 8c may be reversed. In this case too, the effect of suppressing displacement of the optical path caused by heat generation is produced.

FIG. 9A1 to FIG. 10C2 are explanatory views of first to sixth joined forms of the optical component. FIG. 9A1, FIG. 9B1, FIG. 9C1, FIG. 10A1, FIG. 10B1 and FIG. 10C1 are back views of the joined optical component 8. FIG. 9A2, FIG. 9B2, FIG. 9C2, FIG. 10A2, FIG. 10B2 and FIG. 10C2 are vertical sectional views of the optical component 8 and the second mounting portion 5.

As shown in the first joined form, the entire back surface of the optical component 8 may be joined to the second mounting portion 5 with a joining material F. If solder, such as SnAg, is used as the joining material, when the joining material melts, the joining material F spreads over the entire back surface of the optical component 8 by surface tension, so that the entire back surface is joined to the second mounting portion 5.

If a metal nanoparticle sintered material or an inorganic adhesive is used for the joining, as shown in the second to sixth joined forms, the optical component 8 may be joined to the second mounting portion 5 with the joining material F being applied to only part of the back surface of the optical component 8 and solidified there. Joining point(s) for the partial joining may be the center, corners, longitudinal sides extending in the front-back direction or lateral sides extending in the right-left direction of the back surface of the optical component 8, or may be any combination thereof. The partial joining relieves stress that is applied from the joining material F to the optical component 8, and reduces the contact area of the base member 8a and the second mounting portion 5, and consequently can reduce heat transfer to the base member 8a through the second mounting portion 5, and suppress thermal deformation of the optical component 8, and accordingly suppress displacement of the optical path of the outgoing light caused by heat generation of the optical element 11.

As described above, according to the electronic device 10 and the optical element mounting package of the first embodiment, they are each configured to mount the optical element 11 and the optical component 8 in the recess 3. This configuration produces a surface-mount form, and can achieve high heat dissipation even if they are small. Further, the optical component 8 reflects light emitted from the optical element 11, so that the light can be sent out upward. In addition, the optical component 8 is adopted in which the front surface of the transmission film 8c is inclined relative to the reflective surface. Hence, even if the beam characteristics of the optical element 11 are fixed, requests for the angle of beam inclination and the angle of beam spread can be easily met by the selection regarding the optical component 8.

Further, according to the electronic device 10 and the optical element mounting package of the first embodiment, the optical component 8 is a flat mirror, and the second mounting portion 5 is provided with the concave corner 5b with which one end of the optical component 8 is positioned. This can improve mounting accuracy of the optical component 8 and simplify the mounting process.

Further, according to the electronic device 10 and the optical element mounting package of the first embodiment, of the transmission film 8c of the optical component 8, a part near the first mounting portion 4 is thicker than a part far from the first mounting portion 4. This can make the angle of beam spread smaller. Further, if the optical component 8 is a flat mirror, the base member 8a can be curved inward at a point near the first mounting portion 4 by the stress of the transmission film 8c. This can reduce the return light to the optical element 11, and improve reliability of the optical element 11 and extend its life.

Further, according to the electronic device 10 and the optical element mounting package of the first embodiment, the optical component 8 is a flat mirror, and, of the base member 8a, a part near the first mounting portion 4 is thicker than a part far from the first mounting portion 4. This can make heat capacity of the optical component 8 on its side/part to which much heat is transferred if heat diffused from the optical element 11 is transferred to the optical component 8, and consequently reduce the amount of distortion of the optical component 8 caused by heat generation of the optical element 11, and, by extension, suppress displacement of the optical path of the outgoing light caused by heat generation.

Further, according to the electronic device 10 and the optical element mounting package of the first embodiment, the back surface of the optical component 8 includes a joined part and an unjoined part to the second mounting portion 5. This can reduce stress that is applied from the base 2 (lower base 2B) to the optical component 8 and heat that is transferred from the base 2 (lower base 2B) to the optical component 8, and consequently improve stability of the outgoing light from the electronic device 10 and reliability of the electronic device 10.

Second Embodiment

Figure 11:
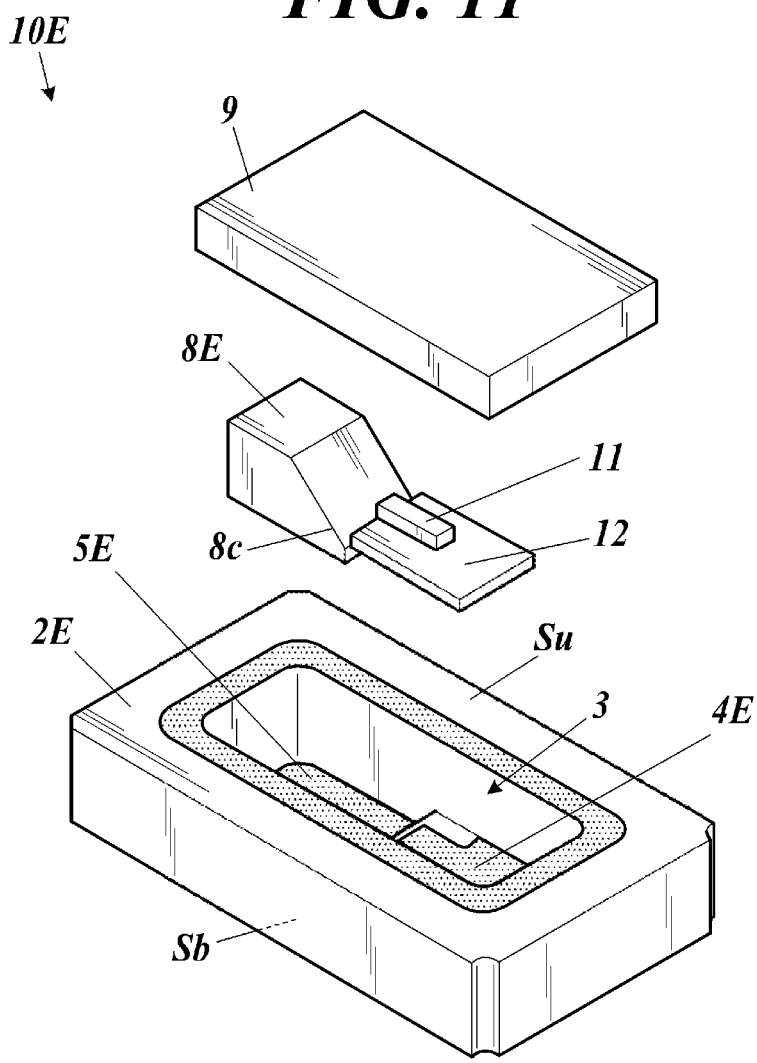
FIG. 11 is an exploded perspective view of an electronic device according to a second embodiment of the present disclosure.

FIG. 11 is an exploded perspective view of an electronic device according to a second embodiment of the present disclosure. The components of the second embodiment same as those of the first embodiment are denoted by the same reference signs, and detailed description thereof is omitted.

An electronic device 10E according to the second embodiment includes: a base 2E having the recess 3; the optical element 11 and an optical component 8E that are mounted in the recess 3; and the lid 9 with which the opening of the recess 3 is closed. The electronic device 10E excluding the lid 9, the optical element 11 and the submount 12 corresponds to the optical element mounting package.

The base 2E is mainly made of an insulating material. The basic shape part of the base 2E is made of a ceramic material, like the upper base 2A of the first embodiment. Of the basic shape part, on the upper surface in the recess 3, the second main surface Sb, the periphery of the opening of the recess 3 on the first main surface Su and/or the like, electrodes are formed, and inside the basic shape part, wiring conductors electrically connecting the electrodes are formed. In the recess 3, a horizontal planar first mounting portion 4E and a horizontal planar second mounting portion 5E are provided. On the first mounting portion 4E, the optical element 11 is mounted through the submount 12 in the same manner as in the first embodiment. On the second mounting portion 5E, the block-shaped optical component 8E is mounted. The optical component 8E has a horizontal bottom surface and a reflective surface inclined relative to the bottom surface, and on the reflective surface, the transmission film 8c, which is the same as that of the first embodiment, is formed.

As described above, according to the electronic device 10E and the optical element mounting package of the second embodiment too, they are each configured to mount the optical element 11 and the optical component 8E in the recess 3. This configuration produces a surface-mount form, and can achieve high heat dissipation even if they are small. Further, the optical component 8 reflects light emitted from the optical element 11, so that the light can be sent out upward. In addition, the optical component 8E is adopted in which the front surface of the transmission film 8c is inclined relative to the reflective surface. Hence, even if the beam characteristics of the optical element 11 are fixed, requests for the angle of beam inclination and the angle of beam spread can be easily met by the selection regarding the optical component 8.

The electronic device 10E and the optical element mounting package of the second embodiment may each adopt, instead of the second mounting portion 5E, a mounting portion having the same shape as that of the second mounting portion 5 of the first embodiment, and each adopt, instead of the optical component 8E of the second embodiment, the optical component 8 of the first embodiment. Adoption thereof can produce the same effects as those described in the first embodiment.

Further, the electronic device 10E and the optical element mounting package of the second embodiment may each adopt, instead of the base 2E, a base having an upper base and a lower base formed of different materials, the lower base being formed of a metal material, like the upper base 2A and the lower base 2B of the first embodiment. Adoption thereof can further improve heat dissipation of the optical element 11.

<Electronic Module>

Figure 12:
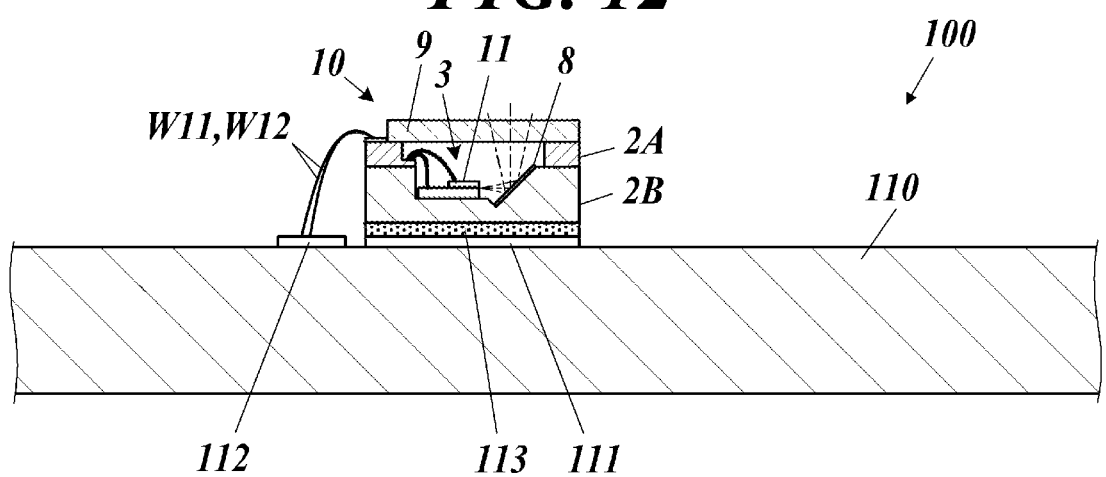
FIG. 12 is a vertical sectional view of a modulate device according to an embodiment of the present disclosure.

FIG. 12 is a vertical sectional view of a module device according to an embodiment of the present disclosure.

An electronic module 100 according to this embodiment of the present disclosure is configured by mounting the electronic device 10 on a module substrate 110. On the module substrate 110, in addition to the electronic device 10, an electronic device(s), an electronic element(s), an electric element(s) and/or the like may be mounted. On the module substrate 110, electrode pads 111, 112 are disposed, and the electronic device 10 is joined to the electrode pad 111 with a joining material 113, such as solder. The electronic module 100 may be configured such that the electrodes D1, D2 of the electronic device 10 are connected to the electrode pad 112 of the module substrate 110 through bonding wires W11, W12, and through these, signals are output from the module substrate 110 to the electronic device 10.

Alternatively, the electronic module 100 according to this embodiment of the present disclosure may be configured by mounting the electronic device 10E of the second embodiment on the module substrate 110. In this case, the electronic module 100 may be configured such that the electrode disposed on the second main surface Sb of the electronic device 10E is joined to the electrode pad 111 of the module substrate 110 with a joining material, such as solder, and through these, signals are output from the module substrate 110 to the electronic device 10E.

As described above, according to the electronic module 100 of this embodiment, the effect of sending out light having requested beam characteristics in and from a small component space can be obtained by the electronic device 10.

In the above, some embodiments of the present disclosure have been described. However, the above embodiments are merely examples. The description of the embodiments is illustrative in every aspect, and hence the present invention is not limited thereto. The present disclosure is also applicable to the embodiments subjected to appropriate combination, change, replacement, addition, omission and/or the like of aspect(s) as far as there is no inconsistency. It is appreciated that not-shown numerous modifications can be envisaged without departing from the scope of the present invention.

INDUSTRIAL APPLICABILITY

The present disclosure is applicable to an optical element mounting package, an electronic device and an electronic module.

The invention claimed is:

1. A mounting package for an optical element, the mounting package comprising:
   a base having a recess that includes a first mounting portion and a second mounting portion, wherein the first mounting portion is configured to mount the optical element to the base;
   a flat mirror having a flat plate shape that is configured to mount to the second mounting portion,
   a reflective surface formed on the flat mirror; and a transmission film formed on the reflective surface, wherein:
  a front surface of the transmission film is inclined relative to the reflective surface,
  an inner surface of the transmission film is bonded to the reflective surface and the inner surface extends along the reflective surface,
  an outer surface opposite the inner surface and the outer surface extends in a direction intersecting the reflective surface and the inner surface, and
  a thickness of the transmission film is gradually reduced from a position closer to the first mounting portion to a position farther from the first mounting portion.

2. The mounting package according to claim 1, wherein the second mounting portion includes a concave corner with which one edge of the flat mirror is positioned.

3. The mounting package according to claim 1, wherein:
the flat mirror includes a base member having one surface that includes the reflective surface, and
of the base member, a part near the first mounting portion is thicker than a part far from the first mounting portion.

4. The mounting package according to claim 1, wherein a back surface of the flat mirror includes a joined part and an unjoined part to the second mounting portion.

5. An electronic device comprising:
an optical element;
a base having a recess that includes a first mounting portion and a second mounting portion, wherein the first mounting portion is configured to mount the optical element to the base;
a flat mirror having a flat plate shape that is configured to mount to the second mounting portion,
a reflective surface formed on the flat mirror; and
a transmission film formed on the reflective surface, wherein:
  a front surface of the transmission film is inclined relative to the reflective surface,
  an inner surface of the transmission film is bonded to the reflective surface and the inner surface extends along the reflective surface,
  an outer surface opposite the inner surface and the outer surface extends in a direction intersecting the reflective surface and the inner surface, and
  a thickness of the transmission film is gradually reduces from a position closer to the first mounting portion to a position farther from the first mounting portion.

6. An electronic module comprising:
the electronic device according to claim 5; and
a module substrate on which the electronic device is mounted.

7. The mounting package according to claim 2, wherein:
the flat mirror includes a base member having one surface that includes the reflective surface, and
of the base member, a part near the first mounting portion is thicker than a part far from the first mounting portion.

8. The mounting package according to claim 2, wherein a back surface of the flat mirror includes a joined part and an unjoined part to the second mounting portion.

9. The mounting package according to claim 3, wherein a back surface of the flat mirror includes a joined part and an unjoined part to the second mounting portion.

10. The mounting package according to claim 7, wherein a back surface of the flat mirror includes a joined part and an unjoined part to the second mounting portion.

* * * * *